(12) United States Patent
Jain et al.

(10) Patent No.: US 7,076,417 B2
(45) Date of Patent: Jul. 11, 2006

(54) METHOD FOR MODELING AND PROCESSING ASYNCHRONOUS FUNCTIONAL SPECIFICATION FOR SYSTEM LEVEL ARCHITECTURE SYNTHESIS

(75) Inventors: Rajiv Jain, Naperville, IL (US); Alan Peisheng Su, Westlake Village, CA (US); Chaitali Biswas, Los Angeles, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 708 days.

(21) Appl. No.: 09/947,250

(22) Filed: Sep. 5, 2001

(65) Prior Publication Data

US 2003/0046044 A1  Mar. 6, 2003

(51) Int. Cl.
*G06F 9/45* (2006.01)
(52) U.S. Cl. .............................. 703/20; 703/2; 703/21; 703/22
(58) Field of Classification Search .................. 703/20, 703/21, 22, 2; 716/5, 7
See application file for complete search history.

(56) References Cited

U.S. PATENT DOCUMENTS

| | | | |
|---|---|---|---|
| 5,493,505 A | | 2/1996 | Banerjee et al. |
| 5,615,127 A | * | 3/1997 | Beatty et al. ................... 716/7 |
| 5,748,489 A | * | 5/1998 | Beatty et al. ................... 716/7 |
| 5,787,009 A | * | 7/1998 | Pedersen ........................ 716/7 |
| 5,870,588 A | * | 2/1999 | Rompaey et al. ............. 703/13 |
| 5,926,632 A | * | 7/1999 | Kawaguchi ..................... 716/7 |
| 6,045,252 A | * | 4/2000 | Pedersen ........................ 716/7 |
| 6,086,628 A | * | 7/2000 | Dave et al. ..................... 716/7 |
| 6,097,886 A | * | 8/2000 | Dave et al. ................... 703/23 |
| 6,110,220 A | * | 8/2000 | Dave et al. ..................... 716/3 |
| 6,112,023 A | * | 8/2000 | Dave et al. ................... 703/27 |
| 6,117,180 A | * | 9/2000 | Dave et al. ................... 703/20 |
| 6,178,542 B1 | * | 1/2001 | Dave ............................ 716/18 |
| 6,289,488 B1 | * | 9/2001 | Dave et al. ..................... 716/1 |
| 6,415,384 B1 | * | 7/2002 | Dave ........................... 713/100 |
| 6,597,664 B1 | * | 7/2003 | Mithal et al. ................ 370/252 |

FOREIGN PATENT DOCUMENTS

WO   WO01/13285 A2   2/2001

OTHER PUBLICATIONS

Michael Sipser, Introduction to the Theory of Computation, 1997, pp. 47-63.*
Udi Manber, Introduciton to Algorithms—A Creative Approach, 1989, pp. 341-347; 357-358.*
Bjame Stroustrup, The C++ Programming Language, 2000, Third Edition, pp. 750-754.*

(Continued)

*Primary Examiner*—Paul L. Rodriguez
*Assistant Examiner*—Jason Proctor

(57) ABSTRACT

A method is disclosed for modeling and processing an asynchronous functional specification to provide an input to an architecture synthesis engine. The method includes the step of generating an initial task graph from the specification, the task graph having a number of executable tasks. Selected data and control connections are established between respective tasks in accordance with a specified set of rules to define some of the tasks to be deterministic, and other of the tasks to be non-deterministic. Each of the control connections is then marked, to provide an annotated task graph for use as an input to the architecture synthesis engine, the annotated task graph enabling the engine to employ specified scheduling techniques.

21 Claims, 2 Drawing Sheets

OTHER PUBLICATIONS

Yuan Xie and Wayne Wolf, "Allocation and scheduling of conditional task graph in hardware/software co-synthesis", Mar. 2001, IEEE, pp. 620-625.*

Robert P. Dick et al, "TGFF: Task Graphs for Free", 1988, IEEE, pp. 1-5.*

Udi Manber, "Introduction to Algorithms, A Creative Approach", 1989, Addison-Wesley, pp. 158-166, 357-370.*

Michael Sipser, "Introduction to the Theory of Computation", 1997, PWS Publishing Co., pp. 10-13.*

Asawaree Kalavade and P.A. Subrahmanyam, "Hardware / Software Partitioning for Multi-function Systems", 1997, IEEE, pp. 516-521.*

Bharat P. Dave and Niraj K. Jha, "CASPER: Concurrent Hardware-Software Co-Synthesis of Hard Real-Time Aperiodic and Periodic Specifications of Embedded System Architectures", 1998, IEEE, pp. 118-124.*

Yu-Kwong Kwok and Ishfaq Ahmad, "Static Scheduling Algorithms for Allocating Directed Task Graphs to Multiprocessors", 1999, ACM, pp. 406-471.*

Inventor(s): Jarrett Sime, Title: "A Synopsis of Parallel Processing Architecture and Operating System Design", Date: Jan. 29, 2001, pp. 1-26.

Search Report under Section 17, Dated Mar. 6, 2003.

* cited by examiner

METHOD FOR MODELING AND PROCESSING ASYNCHRONOUS FUNCTIONAL SPECIFICATION FOR SYSTEM LEVEL ARCHITECTURE SYNTHESIS

BACKGROUND OF THE INVENTION

1. Technical Field of the Invention

The invention pertains to a method for use in connection with an architecture synthesis engine which is disposed to generate and explore alternative system architectures for executing the functional specification of a system in the form of a task graph. More particularly, the invention pertains to a method of the above type of selectively processing or preparing a task graph to serve as a suitable input to the architecture synthesis engine. Even more particularly, the invention pertains to a method of the above type which substantially models and processes asynchronous behavior in the input functional specification.

2. Description of Related Art

As is well known in the art, a computer system typically has a large number and diversity of hardware and software resources which may be employed to execute or complete a particular functional specification. An example of a functional specification known as a task graph would be the set of tasks which must be carried out in order to operate a cellular phone for wireless communication. Generally, many different combinations of hardware and software resources are available to execute a particular task specification, including combinations of only hardware resources, of only software resources, and mixtures of both types of resources. However, while the number of workable combinations may be quite large, some resource combinations are more useful than others, and some resource combinations may have undesirable characteristics or unintended consequences. The comparative merits of different resource combinations are generally determined by timing or other constraints imposed upon implementation of a set of tasks.

As is further known in the art, architecture space exploration is the process of mapping a task specification to a set of resources and time schedules, wherein the set of tasks in the specification may be represented as a graph of interrelated processes and communications, hereinafter referred to as a task graph. The set of resources comprises objects such as software, memory elements, special application specific integrated circuits (ASICs) and processors. Each solution provided by the mapping process has a corresponding architecture, that incorporates a particular combination of resource components and assigns respective tasks to the resource components, and also schedules the timing of task completion. In the past, efforts were made to automate the process of selecting a suitable distribution of resources to define an architecture within the universe of possible architecture solutions known as the design space. Architecture synthesis algorithms were developed for the process. Some of these efforts are described, for example, in "Research Strategies for Architecture Synthesis and Partitioning of Real-Time Systems," Jakob Axelsson, IDA Technical Report, 1996. A computing system configured in accordance with an architecture synthesis algorithm to receive a task graph and a set of resource components as inputs, and which implements the algorithm to generate and explore alternative architectures, may be referred to as an architecture synthesis engine.

The modeling of algorithms for architectural design space exploration, as described above, must consider asynchronous behavior during execution of the algorithm. Algorithms are usually synchronous and deterministic in that for a given set of data, an algorithm follows exactly the same events in the same order (i.e., the execution is predictable and repeatable). Asynchronous behavior in a system occurs when the behavior of the system is unpredictable or unrepeatable. An example of asynchronous behavior is demonstrated by a radio network controller (RNC) in a wireless communication system. The RNC is responsible for the control of radio resources by constantly monitoring bandwidth demand and availability, signal propagation efficiency, and ultimately for the load and congestion of its dominion of cells. The network environment resulting from user location, activity, and signal propagation conditions at any given time is random, hence unpredictable, and user-driven, hence unrepeatable. RNCs employ statistical methods to asynchronously regulate bandwidth allocations, signal power and regulate cell size or macro diversity.

Current architecture synthesis algorithms do not consider execution of asynchronous behavior. A non-deterministic execution of asynchronous behavior makes it difficult to model using a synchronous data flow graph (SDFG). In SDFG predictable and deterministic signals are required to compute the order of execution of every task in order to make sure the graph is viable, that is, that the graph can execute without deadlock or infinite buffer. Accordingly, what is needed is a technique for identifying asynchronous dependencies, and using such information to derive a task graph which is suitable for deterministic scheduling.

SUMMARY OF THE INVENTION

Embodiments of the present invention are generally directed to a method for modeling a computer system and for preparing or processing its functional specification or task graph containing instances of asynchronous behavior to serve as an input to an architecture synthesis engine. The exemplary methods may include generating an initial first task graph from the specification, the first task graph comprising a number of executable tasks with selected connections therebetween, some of the connections comprising data connections and other connections comprising control connections. The method further may comprise identifying all of the control connections from the input task graph to enable the architecture synthesis engine to process the deterministic activity of the system and subsequently account for the structural and temporal overheads incurred due to the asynchronous elements. Each of the connections represents the flow of information from an initiator task to a receptor task and may be a channel for either data or control information. A given control connection may be activated by the initiator task to pre-empt or regulate the ongoing data flow related activity of the corresponding receptor task. Each of the connections of a task graph preferably has an associated average activation rate, which usefully is 1.0 for each data connection, and is a value between 0.0 and 1.0 for each control connection.

By providing the invention described above, prior to a computer architecture synthesis phase, an algorithm is proposed, for the parsing of a task graph to identify and account for asynchronous dependencies before the derivation of an annotated version of task graph which is suitable for deterministic scheduling techniques employed by the architecture synthesis engine. Moreover, the invention retains information regarding asynchronous behavior separately and accounts for the same during architecture construction and evaluation within the engine. These and other benefits and advantages of the invention will become more readily apparent from the ensuing specification taken together with the accompanying drawings.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE EXEMPLARY EMBODIMENTS OF THE INVENTION

Figure 1:
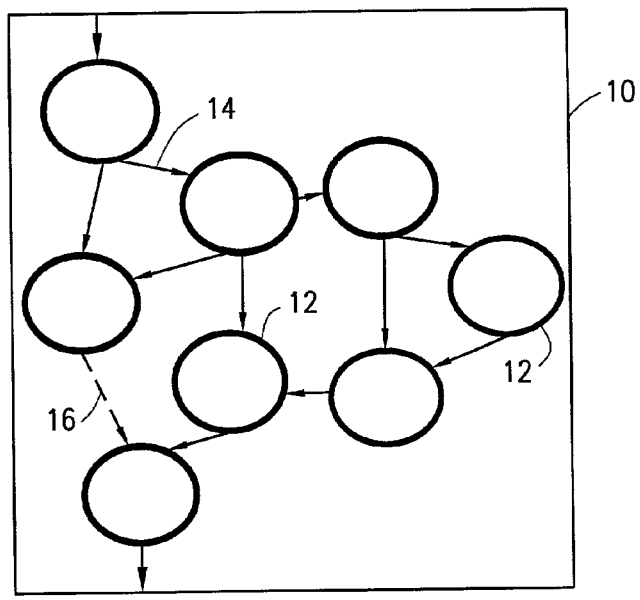
FIG. 1 is a schematic diagram of a task graph containing various data and control associations between the activities of a target system for which an architecture is to be synthesized.

Referring to FIG. 1, there is shown a task graph 10 that is generated from a functional specification describing the overall behavior of a specified algorithm. Task graph 10 comprises a number of tasks 12, which are interconnected by directed data connections 14 and controllable connections 16, described hereinafter in further detail. Each task 12 has a granularity of a function. The function can be, for example, filters, decoders, processors, data storage/retrieval, cache, memory means, graphics ability, communication means, real-time processing, or substantially any other needed function(s) required by a computer system. Also, each task 12 can be executed on either a software component or a hardware component. Respective data connections 14, depicted as solid lines, represent the flow of data information from initiator tasks to corresponding receptor tasks. Respective control connections 16, depicted as dashed or broken lines, represent the flow of control information.

It is emphasized that task graph 10 is constructed in accordance with a set of rules, particularly in regard to placement of respective connections between tasks, to define or identify some tasks to be deterministic and other tasks to be non-deterministic. In accordance with embodiments of the invention, the rules have been selected so that each control connection of task graph 10 can be marked to provide an annotated task graph. That is, a task graph is provided with indicia identifying the respective control connections. The annotated task graph may then be applied to an architecture synthesis engine. The control connection indicia is provided to the scheduler or scheduling component of the engine, whereupon the scheduler disregards or ignores all control connections. The disregarding of the control connections action by the scheduler enables the exemplary architecture synthesis engine to operate in accordance with conventional deterministic scheduling techniques. Moreover, the annotated task graph retains information regarding asynchronous behavior, as described below in connection with average activation rates. The control connection information and asynchronous behavior information is made available at a later time during architecture construction and evaluation within the architecture synthesis engine.

Figure 2:
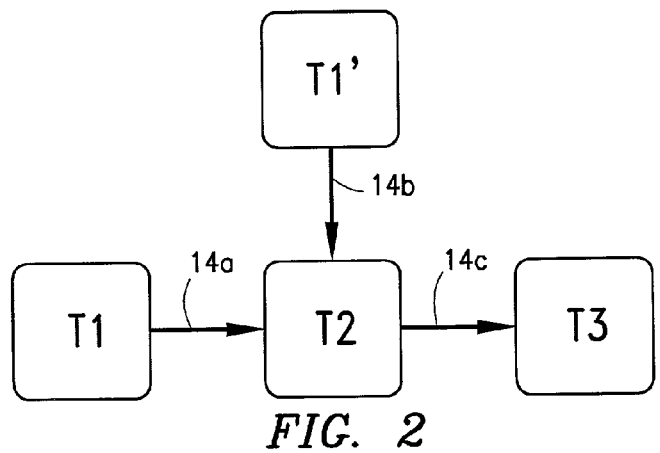
FIGS. 2–4 are schematic diagrams respectively illustrating rules to be used in constructing the task graph of FIG. 1.

Referring to FIG. 2, there is shown a task T2 disposed to receive input data from both tasks T1 and T1', through respective corresponding data connections 14a and 14b. FIG. 2 illustrates one of the rules referred to above, that is, in order for a task to execute, all the input data connections thereto must have valid data. Accordingly, when both T1 and T1' supply data to task T2, task T2 executes and produces data which is input to a task T3, through a further data connection 14c. Task T2 is thus a receptor task with respect to tasks T1 and T1', and is an initiator or source task with respect to task T3.

Figure 3:
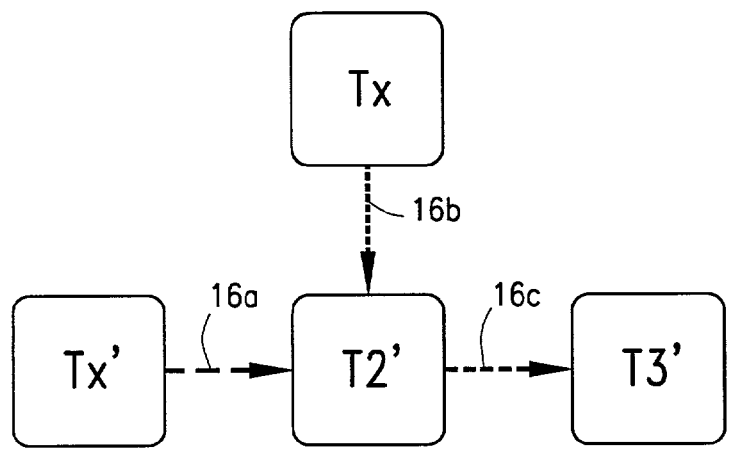

FIG. 3 illustrates a second exemplary rule of the above set, wherein a task T2' has only input control connections 16a and 16b, from tasks TX and TX' respectively. A task that has only control connections as inputs is a non-deterministic task. Moreover, a non-deterministic task cannot be a source or an initiator task for a data connection which is directed to a deterministic task. Thus, T2' is a non-deterministic task and cannot provide input data to a task T3'. Task T2' can only be connected to task T3' by means of a control connection 16c. Non-deterministic tasks are treated as overheads during the execution of a task graph.

Figure 4:
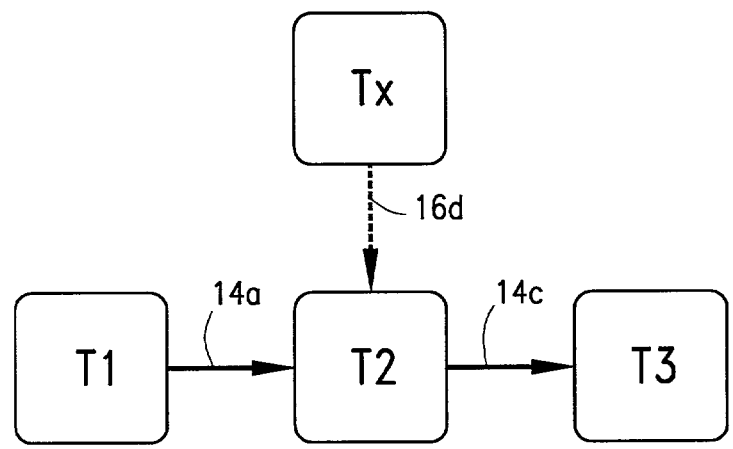
Figure 5:
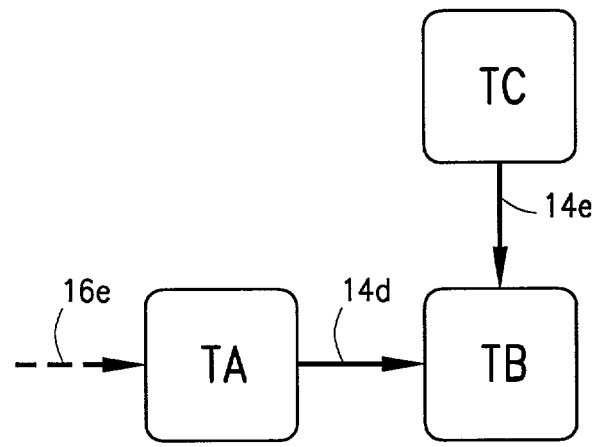
FIG. 5 is a schematic diagram illustrating a violation of the rules to be used in constructing the task graph of FIG. 1.

A task may have both data and control connections at its inputs. To illustrate a further rule, FIG. 4 shows data connection 14a extending from initiator task T1 to receptor task T2, and further shows a control connection 16d extending from task TX to task T2. A control connection may or may not be active at the time that receptor task T2 executes, a control connection being active when control information is being transmitted through it. If control connection 16d in FIG. 4 is inactive when valid data is sent to task T2 through the data connection 14a, task T2 will execute and produce output data. The output data is transferred to task T3 through data connection 14c. However, activation of the control connection 16d shown in FIG. 4 causes the task T2 to execute without producing any output data To further illustrate the rules for constructing task graph 10, FIG. 5 depicts an arrangement that is prohibited by the rules. FIG. 5 shows a data connection 14d directed from task TA to task TB and further shows data connection 14e directed from task TC to task TB. However, the only input connection shown to task TA is a control connection 16e. Accordingly, as stated above in connection with FIG. 3, task TA is non-deterministic, since the only input thereto is a control connection. Also, since task TA is non-deterministic, data connection 14d directed from task TA to task TB is invalid.

As stated above, non-deterministic tasks are treated as overhead during execution of a task graph such as task graph 10. In an embodiment of the invention an average activation rate is determined for every connection in the task graph, where average activation rate is defined to be the probability of the connection having valid data each time the entire task graph is executed. An average activation rate of 1.0 implies the connection is a data connection. If the average activation rate is between 0.0 and 1.0 (exclusive), then the connection is a control connection. Average activation rate values for respective task graph connections are inserted when the task graph is constructed by a designer or user. These values are retained in the annotated task graph when it is generated. Thus, the annotated task graph, when applied to the architecture synthesis engine for use in generating respective architectures, eliminates all dependencies due to control connections, and also makes the overheads due to the asynchronous operation available for use during architecture evaluation.

Figure 6:
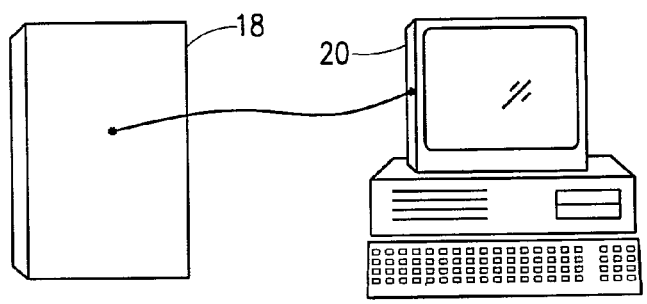
FIG. 6 shows a simplified system which may be used to implement an embodiment of the invention.

An exemplary architecture synthesis engine in accordance with the present invention utilizes a microprocessor based device, such as computer device 20 shown in FIG. 6, and a related data storage apparatus 18. The combination of the microprocessor device 20 and storage apparatus 18 can also be used to implement an exemplary embodiment of the present invention, wherein instructions stored in the storage apparatus 18 direct the microprocessor to generate an annotated task graph as described above. In a modification of the invention, the initial task graph 10 is derived from multiple functional specifications, rather than from just a single specification.

Many other modifications and variations of the present invention are possible in light of the above teachings. It is therefore to be understood that within the scope of the disclosed concept, the invention may be practiced otherwise than as has been specifically described.

We claim:

1. A computerized method for modeling and processing an asynchronous functional specification to provide an input to an architecture synthesis engine in a computer system, said method comprising:
   generating an initial task graph from said asynchronous functional specification, said initial task graph comprising a representation of an executable task, at least one representation of a connection to the executable task, and at least one representation of a connection from the executable task;
   identifying each of the representations of the connections as at least one of a data connection and a control connection based on a predetermined set of rules, wherein the representation of the executable task comprises at least one of a deterministic task and a non-deterministic task;
   generating an annotated task graph, wherein each of the control connection representations is identified as a control connection; and
   transferring said annotated task graph to said architectural synthesis engine in a computer system for processing, wherein each of said control connection identifiers of said annotated task graph direct a scheduling component of said architecture synthesis engine to disregard each of the representations of said control connections when said engine processes said annotated task graph.

2. The method of claim 1, wherein each of the representations of said data connections represents the flow of data and each of the representations of said control connections represents the flow of control information, from a first executable task to a second executable task, and wherein the first executable task is an executable initiator task and the second executable task is an executable receptor task.

3. The method of claim 2, wherein said predetermined set of rules allows the second executable task to comprise a data connection and a control connection as inputs, and requires the second executable task to execute without producing any output data when the input control connection is activated.

4. The method of claim 2, wherein said predetermined set of rules defines an executable receptor task to be a non-deterministic executable receptor task when all input connections to said executable receptor task are control connections.

5. The method of claim 1, wherein said predetermined set of rules prohibits a data connection which is directed from a deterministic task to a non-deterministic task.

6. The method of claim 1, wherein each of said at least one data connection and at least one control connection is further identified by an associated average activation rate.

7. The method of claim 6, wherein each of said average activation rates are provided to said architecture synthesis engine for use during architecture construction and evaluation.

8. The method of claim 6, wherein the average activation rate for each of said data connections is 1.0 and the average activation rate for each of said control connections is between 0.0 and 1.0.

9. The method of claim 1, wherein each of the representations of the executable tasks may be comprised of hardware components or software components.

10. The method of claim 1, wherein said initial task graph is generated from multiple specifications.

11. A computer readable medium, including code for implementing a method for modeling and processing an asynchronous functional specification to provide an input to an architecture synthesis engine in a computer system, said method comprising:
    generating an initial task graph from said asynchronous functional specification, said initial task graph comprising a representation of an executable task, at least one representation of a connection to the executable task, and at least one representation of a connection from the executable task;
    identifying each of the representations of the connections as at least one of a data connection and a control connection based on a predetermined set of rules, wherein the representation of the executable task comprises at least one of a deterministic task and a non-deterministic task;
    generating an annotated task graph, wherein each of the control connection representations is identified as a control connection; and
    transferring said annotated task graph to said architectural synthesis engine in a computer system for processing, wherein each of said control connection identifiers of said annotated task graph direct a scheduling component of said architecture synthesis engine to disregard each of the representations of said control connections when said engine processes said annotated task graph.

12. The computer readable medium of claim 11, wherein each of the representations of said data connections represents the flow of data and each of the representations of said control connections represents the flow of control information, from a first executable task to a second executable task, and wherein the first executable task is an executable initiator task and the second executable task is an executable receptor task.

13. The computer readable medium of claim 12, wherein said predetermined set of rules allows the second executable task to comprise a data connection and a control connection as inputs, and requires the second executable task to execute without producing any output data when the input control connection is activated.

14. The computer readable medium of claim 12, wherein said predetermined set of rules defines an executable receptor task to be a non-deterministic executable receptor task when all input connections to said executable receptor task are control connections.

15. The computer readable medium of claim 12, wherein said set of rules requires each input data connection to the second executable task to carry valid data in order for the second executable task to execute.

16. The computer readable medium of claim 11, wherein said predetermined set of rules prohibits a data connection which is directed from a deterministic task to a non-deterministic task.

17. The computer readable medium of claim 11, wherein each of said at least one data connection and at least one control connection is further identified by an associated average activation rate.

18. The computer readable medium of claim 17, wherein each of said average activation rates are provided to said architecture synthesis engine for use during architecture construction and evaluation.

19. The computer readable medium of claim 17, wherein the average activation rate for each said data connections is 1.0 and the average activation rate for each of said control connections is between 0.0 and 1.0.

20. The computer readable medium of claim 11, wherein each of the representations of the executable tasks may be comprised of hardware components or software components.

21. The computer readable medium of claim 11, wherein said initial task graph is generated from multiple specifications.

* * * * *